(12) United States Patent
Arnold et al.

(10) Patent No.: US 8,084,329 B2
(45) Date of Patent: *Dec. 27, 2011

(54) TRANSISTOR DEVICES AND METHODS OF MAKING

(75) Inventors: John C. Arnold, North Chatham, NY (US); Xuefeng Hua, Guilderland, NY (US); Rangarajan Jagannathan, Hopewell Junction, NY (US); Stefan Schmitz, Malta, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/693,629

(22) Filed: Jan. 26, 2010

(65) Prior Publication Data

US 2010/0187579 A1    Jul. 29, 2010

Related U.S. Application Data

(60) Provisional application No. 61/147,216, filed on Jan. 26, 2009.

(51) Int. Cl.
*H01L 21/336* (2006.01)

(52) U.S. Cl. . 438/285; 438/288; 438/719; 257/E21.409; 257/E29.255

(58) Field of Classification Search .......... 438/285, 438/288, 199, 706, 719
See application file for complete search history.

(56) References Cited

U.S. PATENT DOCUMENTS

| 7,303,949 | B2 * | 12/2007 | Chen et al. ............... 438/199 |
| 7,323,391 | B2 | 1/2008 | Arghavani |
| 7,838,372 | B2 * | 11/2010 | Han et al. ................ 438/300 |
| 2007/0200170 | A1 | 8/2007 | Yamasaki et al. |
| 2007/0267703 | A1 * | 11/2007 | Chong et al. ............. 257/368 |
| 2008/0048217 | A1 * | 2/2008 | Kim et al. ............... 257/288 |
| 2008/0128746 | A1 * | 6/2008 | Wang ..................... 257/190 |
| 2008/0277699 | A1 | 11/2008 | Chakravarthi et al. |
| 2009/0140351 | A1 * | 6/2009 | Lin et al. ................ 257/407 |
| 2010/0187578 | A1 * | 7/2010 | Faltermeier et al. ....... 257/288 |
| 2010/0237431 | A1 * | 9/2010 | Feudel et al. ............ 257/369 |

* cited by examiner

*Primary Examiner* — Alexander Ghyka
(74) *Attorney, Agent, or Firm* — Cantor Colburn LLP; Joseph Petrokaitis

(57) ABSTRACT

In an embodiment, a method of fabricating a transistor device comprises: providing a semiconductor topography comprising a gate conductor disposed above a semiconductor substrate between a pair of dielectric spacers; anisotropically etching exposed regions of the semiconductor substrate on opposite sides of the dielectric spacers to form recessed regions in the substrate; oxidizing exposed surfaces of the substrate in the recessed regions to form an oxide thereon; removing the oxide from bottoms of the recessed regions while retaining the oxide upon sidewalls of the recessed regions; and isotropically etching the substrate such that the recessed regions undercut the pair of dielectric spacers.

13 Claims, 8 Drawing Sheets

TRANSISTOR DEVICES AND METHODS OF MAKING

This non-provisional application claims the benefit of the provisional application filed with the U.S. Patent and Trademark Office as Ser. No. 61/147,216 entitled "Improved Transistor Devices and Methods of Making", filed Jan. 26, 2009.

BACKGROUND

This invention relates to semiconductor fabrication, and particularly to fabricating improved transistor devices.

Integrated circuits often employ active devices known as transistors such as field effect transistors (FETs). A FET includes a silicon-based substrate comprising a pair of impurity regions, i.e., source and drain junctions, spaced apart by a channel region. A gate conductor is dielectrically spaced above the channel region of the silicon-based substrate. The junctions can comprise dopants which are opposite in type to the dopants residing within the channel region interposed between the junctions. The gate conductor can comprise a doped semiconductive material such as polycrystalline silicon ("polysilicon"). The gate conductor can serve as a mask for the channel region during the implantation of dopants into the adjacent source and drain junctions. An interlevel dielectric can be disposed across the transistors of an integrated circuit to isolate the gate areas and the junctions. Ohmic contacts can be formed through the interlevel dielectric down to the gate areas and/or junctions to couple them to overlying interconnect lines.

Demands for increased performance, functionality, and manufacturing economy for integrated circuits have resulted in extreme integration density and scaling of devices to very small sizes. Transistor device scaling has restricted operating margins and has adversely affected the electrical characteristics of such devices. As such, more emphasis has been placed on achieving higher operating frequencies for transistor devices through the use of stress engineering to improve the carrier mobility of such devices rather than through the use of scaling.

Carrier mobility in the channel of a FET device can be improved by applying mechanical stresses to the channel to induce tensile and/or compressive strain in the channel. The application of such mechanical stresses to the channel can modulate device performance and thus improve the characteristics of the FET device. For example, a process-induced tensile strain in the channel of an n-type (NFET) device can create improved electron mobility, leading to higher saturation currents.

One method employed to induce strain in the channel region has been to place a compressively strained nitride film close to the active region of the FET device. Another approach taken to induce strain in the channel of a p-type (PFET) device has been to isotropically etch recessed regions in the silicon-based substrate on opposite sides of the channel region, followed by epitaxially growing silicon germanium (e-SiGe) in the recessed regions to form source and drain regions. When epitaxially grown on silicon, an unrelaxed SiGe layer can have a lattice constant that conforms to that of the silicon substrate. Upon relaxation (e.g., through a high temperature process) the SiGe lattice constant approaches that of its intrinsic lattice constant, which is larger than that of silicon. Consequently, physical stress due to this mismatch in the lattice constant is applied to the silicon-based channel region.

BRIEF SUMMARY

In one embodiment, a method of fabricating a transistor device includes: providing a semiconductor topography comprising a gate conductor disposed above a semiconductor substrate between a pair of dielectric spacers; anisotropically etching exposed regions of the semiconductor substrate on opposite sides of the dielectric spacers to form recessed regions in the substrate; oxidizing exposed surfaces of the substrate in the recessed regions to form an oxide thereon; removing the oxide from bottoms of the recessed regions while retaining the oxide upon sidewalls of the recessed regions; and isotropically etching the substrate such that the recessed regions undercut the pair of dielectric spacers.

In another embodiment, a transistor device includes a gate conductor spaced above a semiconductor substrate by a gate dielectric and disposed between a pair of dielectric spacers, wherein the semiconductor substrate comprises recessed regions on opposite sides of the dielectric spacers having substantially semi-circular shaped sidewalls that extend under the dielectric spacers, and wherein upper ends of the sidewalls are laterally spaced from the gate dielectric; and at least one of the following: epitaxially grown source and drain regions disposed in the recessed regions of the semiconductor substrate that undercut the dielectric spacers, and a dielectric material disposed in the recessed regions of the semiconductor substrate that undercut the dielectric spacers.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

Figure 1:
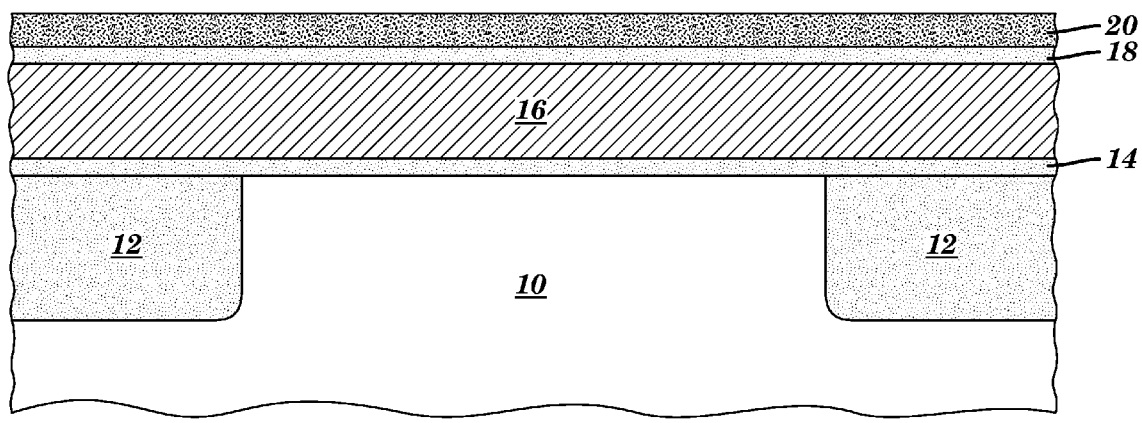
FIGS. 1-8 illustrate an example of a method for fabricating an improved transistor device.

Turning now to the drawings in greater detail, it will be seen that FIGS. 1-8 illustrate an exemplary embodiment of a method for fabricating improved FET devices. As shown in FIG. 1, a bulk semiconductor substrate 10 comprising single crystalline silicon that has been slightly doped with n-type or p-type dopants is first obtained to form the FET device. Alternatively, a semiconductor layer 10 can be formed upon an insulation layer (not shown) to create a silicon-on-insulator (SOI) FET device. Shallow trench isolation structures 12 can be formed in the semiconductor substrate 10 on opposite sides of the ensuing FET device to isolate it from other active areas in the substrate 10. A gate dielectric 14 comprising, e.g., thermally grown silicon dioxide ($SiO_2$) or deposited hafnium-based oxide (e.g., $HfO_2$), can then be formed across the substrate 10. Next, a gate conductor layer 16 comprising, e.g., polycrystalline silicon ("polysilicon"), can be deposited across the gate dielectric 14. Dielectric capping layers, such as silicon dioxide ("oxide") layer 18 and silicon nitride ("nitride", $Si_3N_4$) layer 20, also can be deposited across the gate conductor layer 16.

Figure 2:
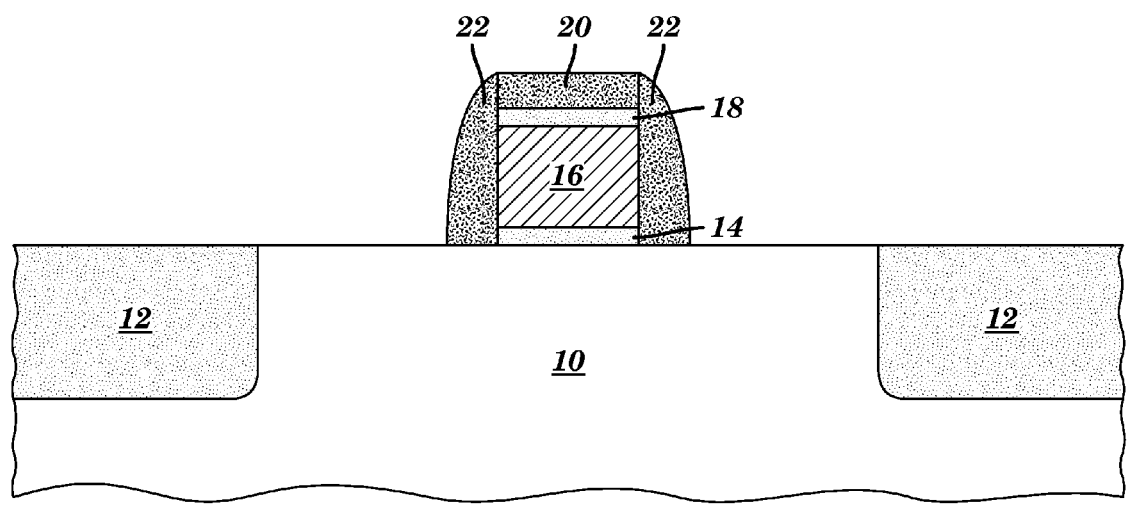

Subsequently, the gate conductor layer 16, the gate dielectric 14, the oxide layer 18, and the nitride layer 20 can be patterned using lithography and an anisotropic etch technique, e.g., reactive ion etching (RIE), to form the gate conductor structure shown in FIG. 2. Dielectric spacers 22 comprising a dielectric such as nitride can be formed upon the opposed sidewall surfaces of the gate conductor 16 via deposition of a dielectric followed by an anisotropic etch, which etches the dielectric at a faster rate in the vertical direction than in the horizontal direction.

Figure 3:
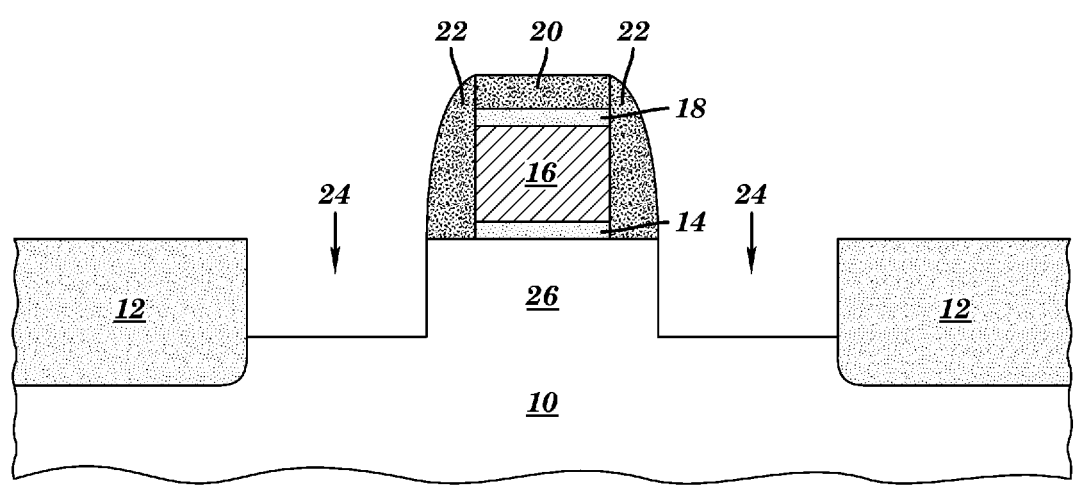

Turning now to FIG. 3, areas of the substrate 10 on opposite sides of the spacers 22 can be anisotropically etched after using lithography to define an etch mask such as photoresist over surfaces outside of those areas of the substrate 10. This anisotropic etch can be performed via an RIE process. Examples of suitable gases for use in the RIE process include but are not limited to a mixture of hydrogen bromide (HBr) with oxygen ($O_2$) and an inert such as helium (He) or argon (Ar), chlorine ($Cl_2$), boron trichloride ($BCl_3$), and various fluorocarbons. As a result of this anisotropic etch, recessed regions 24 are formed in the substrate 10 on opposite sides of a channel region 26 having substantially vertical sidewalls.

Figure 4:
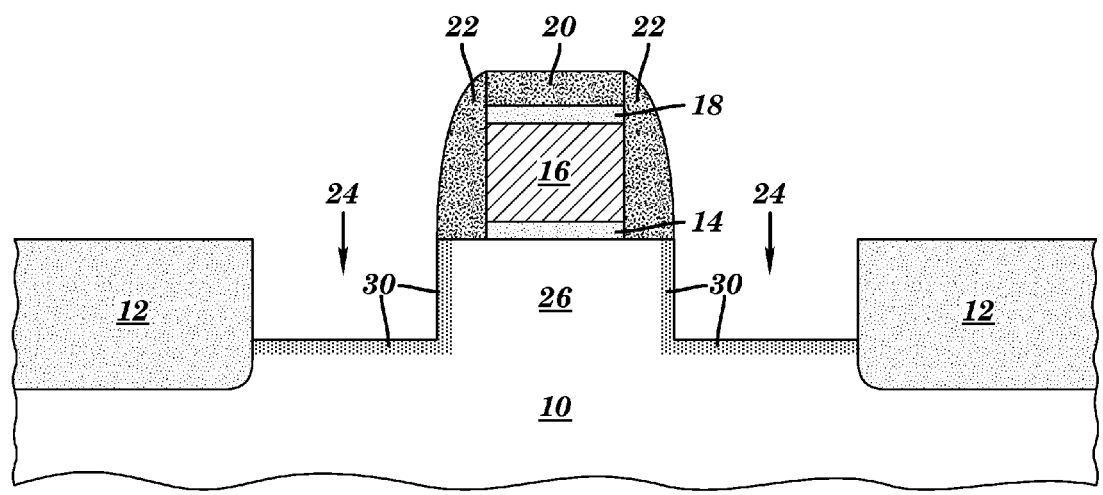

Next, as shown in FIG. 4, the exposed surfaces of the substrate 10, which comprise silicon, can be oxidized to form an oxide 30 ($SiO_2$) upon the bottoms and sidewalls of the recessed regions 24. This oxidation can be performed using a suitable process such as exposing the silicon-based substrate 10 to an oxygen bearing plasma or thermal oxidation of the substrate 10. The conditions of the oxidation process can be selected to ensure that the oxide 30 is sufficiently thick to resist removal from the sidewalls of the recessed regions 24 during a subsequent isotropic etch.

Figure 5:
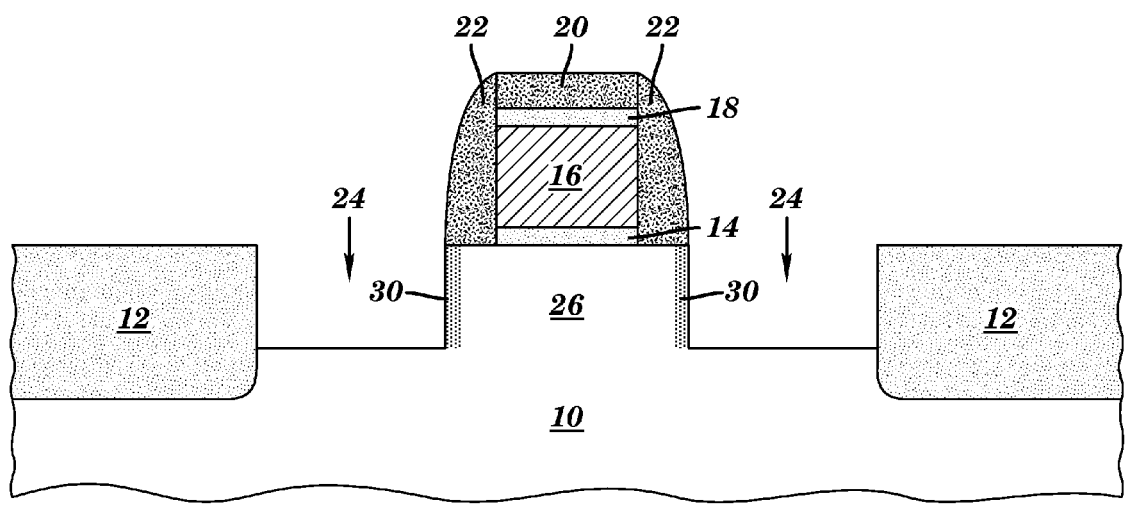

Subsequently, as depicted in FIG. 5, the oxide 30 formed upon the bottoms of the recessed regions 24 can be selectively removed while retaining the oxide 30 formed upon the sidewalls of the recessed regions 24. This selective removal of the oxide 30 disposed at the bottoms of recessed regions 24 can be performed using a suitable process. For example, if the oxide 30 is relatively thin, e.g., less than 5 nanometers (nm), it can be physically sputtered away using an inert species such as argon ions. However, if the oxide 30 is relatively thick, e.g., greater than 5 nm, it can be anisotropically etched using a plasma comprising fluorine.

Figure 6:
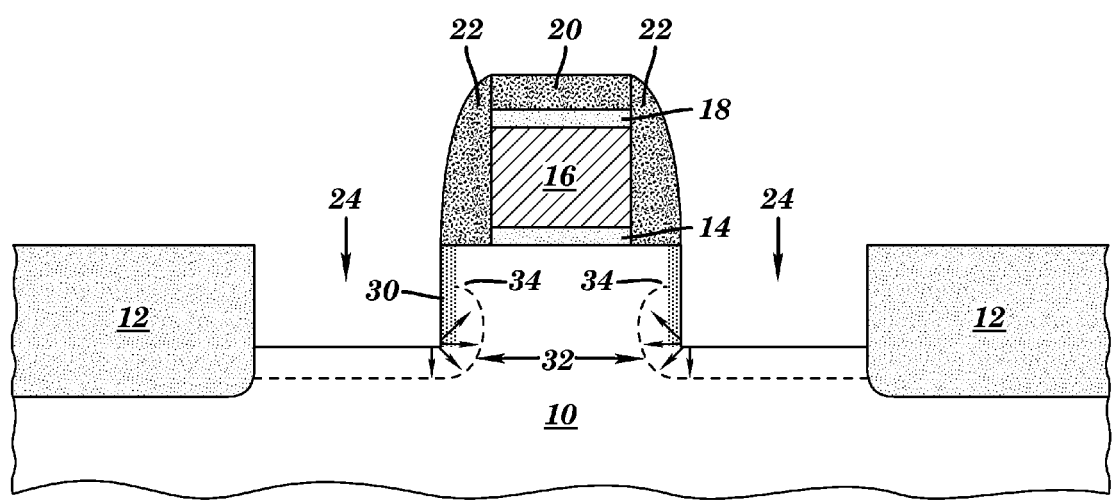

The oxide 30 retained upon the sidewalls of the recessed regions 24 can protect those sidewalls during a subsequent isotropic etch of the silicon-based substrate 10, as shown in FIG. 6. The conditions and chemistry of the isotropic etch process are desirably selected to allow the etching of the substrate 10 to proceed in all directions from the bottom of the oxide 30 disposed on the sidewalls such that the recessed regions 24 penetrate farther underneath the channel 26. The substrate 10 can be removed at an appreciable rate without unduly damaging the oxide 30. By way of example, a chlorine bearing plasma, a fluorine bearing plasma, a bromine bearing plasma, or a combination comprising at least one of the foregoing can be used to selectively etch the silicon since a Si—O bond has a higher energy as compared with a Si—Si bond. A specific example of a gas mixture for performing the isotropic etch is a mixture of chlorine ($Cl_2$), sulfur hexafluoride ($SF_6$), and nitrogen ($N_2$). Since the isotropic etch occurs at the same rates in the vertical and horizontal directions, etching proceeds downward at the trench bottom and laterally under the dielectric spacers 22 from the bottom corners of the sidewalls of recessed regions 24, as illustrated by arrows 32. If the etching is completely isotropic, etching also proceeds upward toward the gate dielectric 14, thereby forming substantially semi-circular sidewalls 34 beneath the spacers 22 on opposite sides of the channel regions 26. Due to the presence of the oxide 30 on the original lateral sidewalls of the channel region 26, lateral etching is allowed to proceed for a longer period of time before the upper ends of the sidewalls 34 approach the gate dielectric 14.

Figure 7:
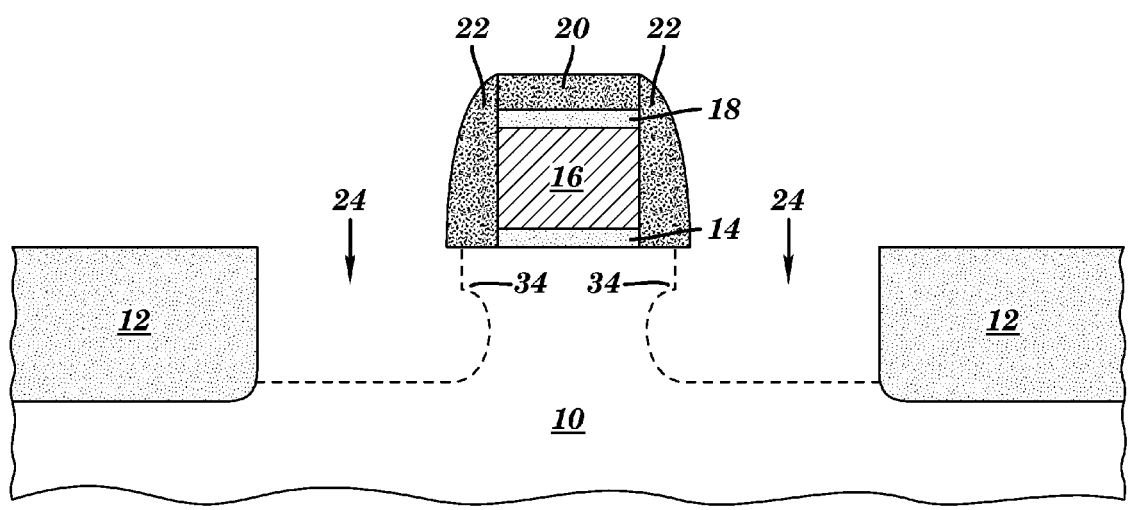

After the isotropic etch, the exposed surfaces can be cleaned using, e.g., a hydrofluoric acid dip, that also removes the oxide 30, leaving behind the final profile of the sidewalls 34 depicted in FIG. 7. Different profiles for the sidewalls 34 can be obtained by adjusting the balance between the depth of the anisotropic etch shown in FIG. 3 and the duration of the isotropic etch shown in FIG. 6.

Figure 8:
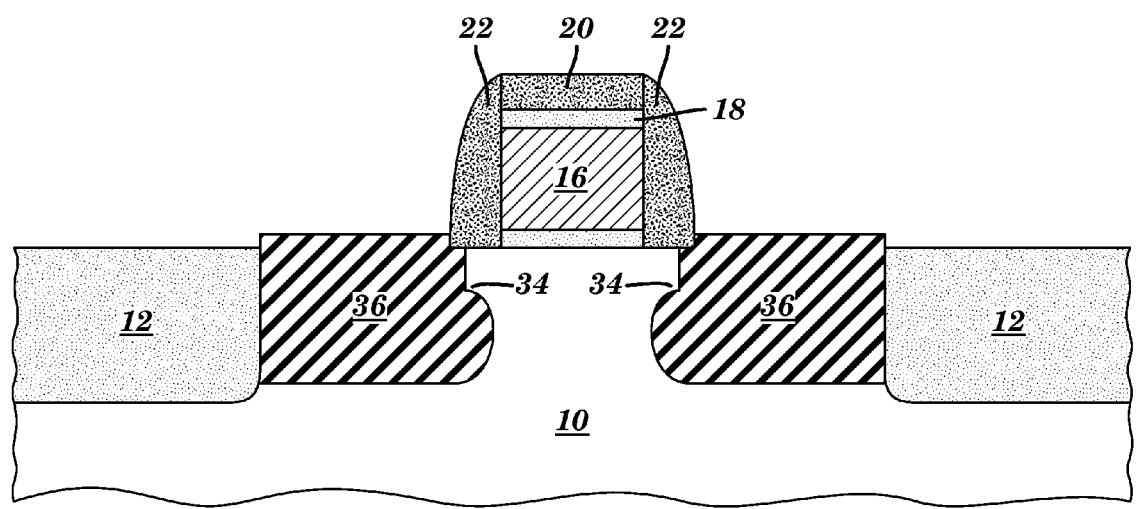

Next, as shown in FIG. 8, epitaxially grown source and drain regions 36 can be formed in the recessed regions 24 such that they undercut the dielectric spacers 22. The epitaxial growth can be performed at a temperature of about 500° C. to about 900° C. and a pressure of about 1 Torr to about 100 Torr using precursors such as $SiH_4$, $SiH_2Cl_2$, $GeH_4$, HCl, $B_2H_6$, $SiH_3CH_3$, etc. In a preferred embodiment, the epitaxial growth is performed at a temperature of about 700° C. and a pressure of about 10 Torr. When forming a PFET device, the epitaxial source and drain regions 36 can comprise, e.g., silicon germanium (SiGe), and when forming an NFET device, the epitaxial source and drain regions 36 can comprise, e.g., silicon carbide (SiC). It is to be understood that the scope of this application is not limited to epitaxially grown source and drain regions. Other materials may also be formed in recessed regions 24, including but not limited to deposited and doped semiconductive materials and dielectric materials such as $SiO_2$ that serve to partially isolate the channel 26 from the substrate 10.

After formation of the epitaxial source and drain regions 36, the nitride and oxide capping layers 18 and 20 can be removed to allow metal silicide contact areas and metal contacts to be formed on the gate conductor 16 and the source and drain regions 36. One method that can be employed to remove the capping layers 18 and 20 can be through the use of an isotropic etch that also removes the dielectric spacers 22. Alternatively, the capping layers 18 and 20 can be removed using an RIE process.

The foregoing methods of fabricating improved FET devices utilize an anisotropic etch followed by an isotropic etch to form recessed regions in the silicon-based substrate as opposed to using only an isotropic etch. Moreover, an oxide is used to protect the silicon sidewalls exposed by the anisotropic etch such that the starting point of the isotropic etch is shifted downward to the bottom corner of the oxidized sidewalls. As such, the isotropic etch can be allowed to progress farther laterally under the gate structure before threatening the underside of the gate dielectric than if no prior anisotropic etch had been performed. Thus, there is no need to be concerned that the gate dielectric could be damaged during the etch and pre-epitaxy cleaning of the recessed regions. This method therefore allows the epitaxial source and drain regions to be strategically placed closer to the channel and even partially underneath the channel to maximize the stress applied to the channel and thus enhance the carrier mobility in the channel.

As used herein, the terms "a" and "an" do not denote a limitation of quantity but rather denote the presence of at least one of the referenced items. Moreover, ranges directed to the same component or property are inclusive of the endpoints given for those ranges (e.g., "about 5 nanometers (nm) to about 20 nm," is inclusive of the endpoints and all intermediate values of the range of about 5 nm to about 20 nm). Reference throughout the specification to "one embodiment", "another embodiment", "an embodiment", and so forth means that a particular element (e.g., feature, structure, and/or characteristic) described in connection with the embodiment is included in at least one embodiment described herein, and might or might not be present in other embodiments. In addition, it is to be understood that the described elements may be combined in any suitable manner in the various embodiments. Unless defined otherwise, technical and scientific terms used herein have the same meaning as is commonly understood by one of skill in the art to which this invention belongs.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of fabricating a transistor device, comprising:
   providing a semiconductor topography comprising a gate conductor disposed above a semiconductor substrate between a pair of dielectric spacers;
   anisotropically etching exposed regions of the semiconductor substrate on opposite sides of the dielectric spacers to form recessed regions in the substrate;
   oxidizing exposed surfaces of the substrate in the recessed regions to form an oxide thereon;
   removing the oxide from bottoms of the recessed regions while retaining the oxide upon sidewalls of the recessed regions; and
   isotropically etching the substrate such that the recessed regions undercut the pair of dielectric spacers.

2. The method of claim 1, wherein said oxidizing the exposed surfaces of the substrate comprises exposing the substrate to an oxygen bearing plasma.

3. The method of claim 1, wherein said removing the oxide from the bottoms of the recessed regions comprises sputtering the oxide using inert ions.

4. The method of claim 1, wherein said removing the oxide from the bottoms of the recessed regions comprises anisotropically etching the oxide using a plasma comprising fluorine.

5. The method of claim 1, wherein the substrate comprises silicon, and wherein said isotropically etching the substrate comprises selectively etching the silicon while retaining the oxide upon the sidewalls of the recessed regions.

6. The method of claim 5, wherein the isotropic etching is performed using a chlorine bearing plasma, a fluorine bearing plasma, a bromine bearing plasma, or a combination comprising at least one of the foregoing.

7. The method of claim 5, wherein the isotropic etching is performed using a gas mixture comprising chlorine ($Cl_2$), sulfur hexafluoride ($SF_6$), and nitrogen ($N_2$).

8. The method of claim 1, further comprising removing the oxide retained upon the sidewalls of the recessed regions subsequent to said isotropically etching the substrate.

9. The method of claim 1, wherein the sidewalls of the recessed regions are substantially semi-circular shaped as a result of the isotropic etch.

10. The method of claim 1, further comprising epitaxially growing source and drain regions in the recessed regions of the semiconductor substrate such that the source and drain regions extend underneath the dielectric spacers.

11. The method of claim 10, wherein the transistor device is a PFET device and the epitaxially grown source and drain regions comprise silicon germanium.

12. The method of claim 10, wherein the transistor device is an NFET device and the epitaxially grown source and drain regions comprise silicon carbide.

13. The method of claim 1, further comprising filling the recessed regions with a dielectric material to partially isolate a channel region disposed beneath the gate conductor.

* * * * *